(12) United States Patent
Wu et al.

(10) Patent No.: US 6,779,075 B2
(45) Date of Patent: Aug. 17, 2004

(54) DDR AND QDR CONVERTER AND INTERFACE CARD, MOTHERBOARD AND MEMORY MODULE INTERFACE USING THE SAME

(75) Inventors: Kun Ho Wu, Kaohsiung (TW); Hai Feng Chuang, Tainan (TW)

(73) Assignee: Leadtek Research Inc., Taipei Hsien (TW)

( * ) Notice: Subject to any disclaimer, the term of this patent is extended or adjusted under 35 U.S.C. 154(b) by 404 days.

(21) Appl. No.: 09/932,627

(22) Filed: Aug. 17, 2001

(65) Prior Publication Data

US 2002/0174274 A1 Nov. 21, 2002

Related U.S. Application Data

(60) Provisional application No. 60/291,376, filed on May 15, 2001.

(51) Int. Cl.[7] .............................................. G06F 12/00
(52) U.S. Cl. .................. 711/105; 711/167; 365/189.02; 365/230.04; 365/233
(58) Field of Search .................................. 711/105, 167; 365/189.01–189.02, 230.02–230.08, 233

(56) References Cited

U.S. PATENT DOCUMENTS 6,061,292 A * 5/2000 Su et al. ................. 365/230.06
6,275,441 B1 * 8/2001 Oh ......................... 365/230.04
6,600,693 B2 * 7/2003 Kim ........................... 365/233

* cited by examiner

Primary Examiner—Nasser Moazzami
(74) Attorney, Agent, or Firm—J.C. Patents

(57) ABSTRACT

A DDR and QDR converter and an interface, a motherboard and a memory module interface using the same. The DDR and QDR converter has a QDR interface, a DDR interface and a conversion core. The QDR interface is used to exchange a signal with QDR devices. The DDR interface is used to exchange a signal with DDR devices. The conversion core is used to convert QDR command and data formats into DDR command and data formats, and to convert DDR command and data formats into QDR command and data formats.

14 Claims, 8 Drawing Sheets

DDR AND QDR CONVERTER AND INTERFACE CARD, MOTHERBOARD AND MEMORY MODULE INTERFACE USING THE SAME

CROSS-REFERENCE TO RELATED APPLICATION

This application claims the priority benefit of U.S.A. provisional application No. 60/291,376, filed May 15, 2001.

BACKGROUND OF THE INVENTION

1. Field of the Invention

The invention relates a memory converter and the apparatus for applying the same. More particularly, the invention relates to a DDR and QDR converter, and an interface, a motherboard, a memory module and a portable computer motherboard using the DDR and QDR converter.

2. Description of the Related Art

Along with the advancement in techniques for wafer fabrication and package process, and in addition to the rapid growth in processing speed of the central processing unit (CPU), various alterations of a computer's memory management have occurred. Demand for access speed has pushed the development of memory from the early dynamic random access memory (RAM), the extended data output random access memory (EDO RAM), to the current synchronous data rate RAM (SDR RAM) and double data rate RAM (DDR RAM). The enhancement of access speed of the memory has caused a higher fabrication cost for various kinds of RAM's.

SUMMARY OF THE INVENTION

The present invention provides a method and a structure with a higher access speed compared to the current memory to significantly improve the efficiency of the DDR RAM's without incurring high fabrication cost. The structure is called "quadruple data rate RAM (QDR)". The invention includes the formation of the ADR signal system and the conversion method between the DDR and QDR signal systems. The conversion structure and method provided by the invention can be applied to all the electronic equipment that requires RAM, such as interface cards, motherboards and portable computer motherboards.

The DDR and QDR converter provided by the invention has a QDR interface, a DDR interface, a clock controller, a command controller, a state register and a data converter. The QDR interface is used to exchange a signal with a QDR device. The DDR interface is used to exchange a signal with a DDR device. The clock controller converts the clock signal sent from the QDR device into a clock used by the converter and the DDR device. After receiving a QDR command signal from the QDR device, the command controller processes the QDR command signal into a corresponding DDR command signal and outputs the DDR command signal into the DDR device. The state register is used to store data of the mode register set (MRS) and the extended mode register set (EMRS), and to provide conversion data to the command controller for appropriate command and data conversion. The data converter is used to convert the QDR data format into a DDR data format, and convert the DDR data format into a QDR data format.

In one embodiment of the invention, the data converter comprises a data mask and probe controller, a QDR-to-DDR data converter and a DDR-to-QDR data converter. The data mask and probe controller is used to obtain the QM signal and DQS signal of the QDR device. The QM signal is then converted into a DDR QM signal output to the DDR device, while the DQS signal is converted into a data extract signal for the QDR device to extract data from the DDR device. The QDR-to-DDR data converter converts the serial signal of the QDR device into a parallel signal. According to the command of the command controller, the parallel signal is sent to two DDR devices. The DDR-to-QDR data converter converts two data signals of the DDR device into the serial signals used by the QDR device, which are then sent to the QDR device according to the command output from the command controller.

According to the above, a conversion channel is established between QDR and DDR, so that DDR can operate normally in a system or apparatus supporting QDR without converting the system or apparatus into a DDR supporting system or apparatus. The DDR and QDR can thus operate normally simultaneously.

Therefore, the user does not have to buy an additional QDR memory module. The invention uses the existent DDR memory module to upgrade to a memory module with both the DDR and QDR functions.

For the manufacturer, DDR chips with a lower cost can be selected while manufacturing the interface, motherboard and related printed circuit boards to obtain a product with the QDR data process effect. The quality and performance of the product are enhanced without raising the fabrication cost.

Both the foregoing general description and the following detailed description are exemplary and explanatory only and are not restrictive of the invention, as claimed.

BRIEF DESCRIPTION OF SEVERAL VIEWS OF THE DRAWING

These, as well as other features of the present invention, will become more apparent upon reference to the drawings, wherein.

DETAILED DESCRIPTION OF THE PREFERRED EMBODIMENT

Figure 1A:
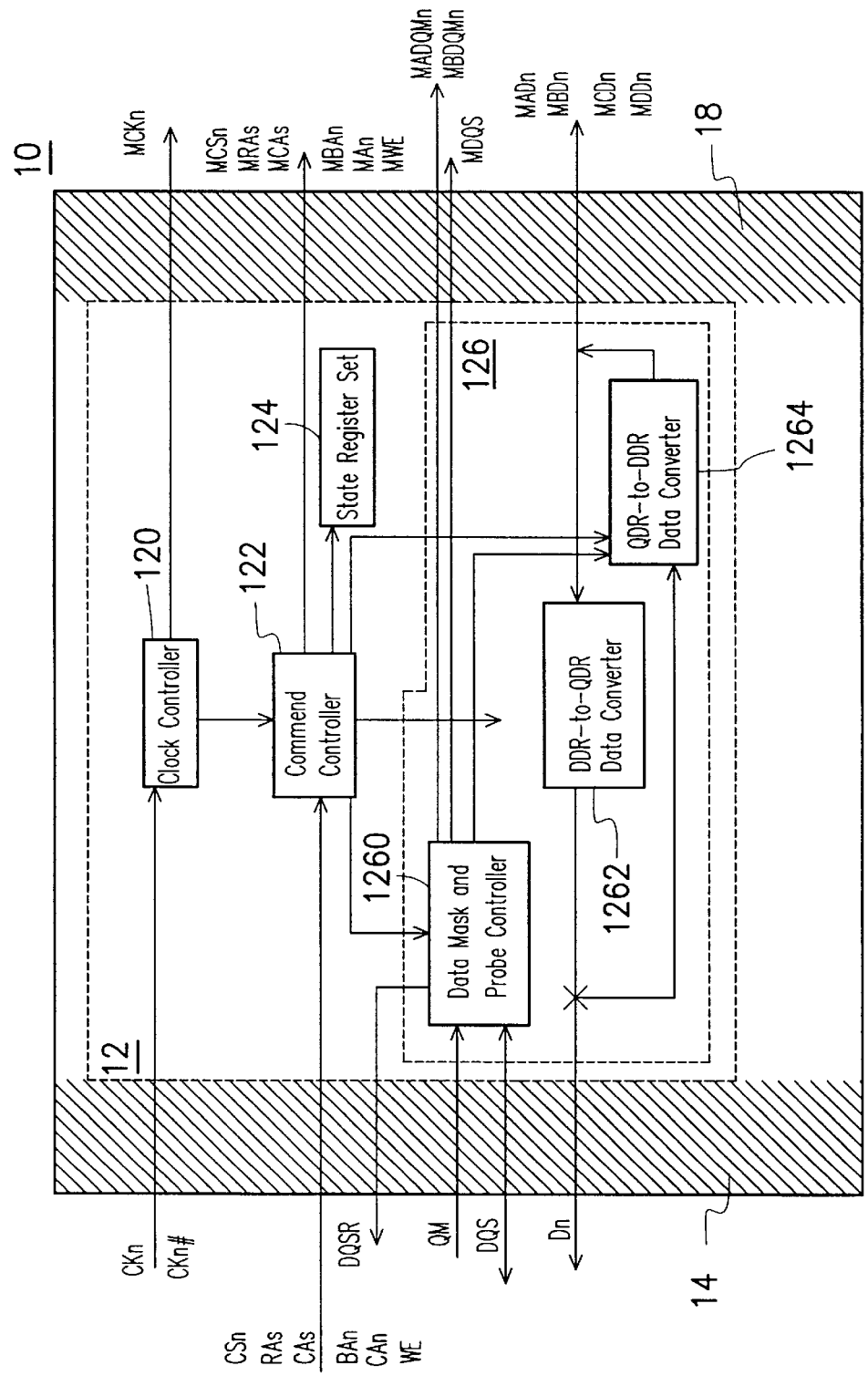
FIG. 1A shows a block diagram of a converter in a first embodiment of the invention.

In FIG. 1A, a block diagram of a converter in a first embodiment of the invention is shown. The DDR and QDR converter 10 comprises a QDR interface 14, a DDR interface 18 and a conversion core 12. The converter 10 is referred to as "DQDR" here.

The QDR interface 14 performs a signal exchange between the QDR memory module and the conversion core 12. The DDR interface 18 performs a signal exchange between the DDR memory module and the conversion core 12. In FIG. 1A, a block diagram of one embodiment of the conversion core 12 is illustrated in detail. In this embodiment, the conversion core 12 comprises a clock controller 120, a command controller 122, a state register 124 and a data converter 126. The clock controller 120 converts the clock signal CKn, CKn# sent from the QDR memory module into a clock MCKn used internally for the converter 10 and the DDR module.

The command controller 122 is used receive the QDR command sent from the QDR memory module, including CSn, RAS, CAS, Ban, Can and WE. The QDR command signal is then processed as a corresponding DDR command such as MCSn, MRAS, MCAS, MBAn, MAn and MWE, which is then sent to the DDR memory module. When the QDR command includes the data access, for example, when the QDR command includes the read or write commands of the data, the data converter 126 activates the function control mechanism, including the data mask and probe mechanism, the QDR-to-DDR data conversion mechanism, and DDR-to-QDR data conversion mechanism. These mechanisms enable the data converter 126 to convert the QDR data format into the appropriate DDR data format, and to convert the DDR data format into the appropriate QDR data format. The state register set 124 is used to store the data in the mode register set MRS and the extended mode register set EMRS used by the QDR interface.

For a further detailed description, FIG. 1A further includes a block diagram of the internal circuit of the data converter 126. In this embodiment, the data converter 126 further comprises a data mask and probe controller 1260, a DDR-to-QDR data converter 1262 and a QDR-to-DDR data converter 1264.

When the function control mechanism is activated, that is, when the data is read or written, the data mask and probe controller 1260 obtains the QM signal and DQS signal of the QDR memory module, and converts the QM signal into a DDR QM signal input to the DDR memory module. The DQS signal is also converted into a QDR-to-DDR data extraction signal for data extraction. When the QDR command signal is a data reading command, the QDR-to-DDR data converter 1264 converts the serial signals of the QDR device into parallel signals. According to the command of the command controller 122, the parallel signals are transmitted to two DDR devices separately. When the QDR command signal is a data writing command, the DDR-to-QDR data converter 1262 converts two data signals of the DDR device into the serial signals used by the QDR device. According to the command of the command controller 122, the serial signals are transmitted to the QDR device.

Since four bits are output within a QDR cycle, while two bits are output within a DDR cycle, the process speed and efficiency of the QDR is superior to that of DDR. In the above embodiment, the DDR and QDR converter is designed with one QDR device corresponding to two DDR devices. It is known to one of ordinary skill in the art that the converter can also be designed with one QDR corresponding with one DDR device. However, the efficiency of such design is significantly decreased. To maintain the same efficiency, the frequency of the DDR has to be increased to two times that of the QDR, for the DDR to output the same number of bits as the QDR. With the current technique, it is difficult to increase the frequency of DDR with a reasonable fabrication cost. The invention is preferably applied to the combination of two sets of DDR modules to generate the QDR efficiency.

Figure 1B:
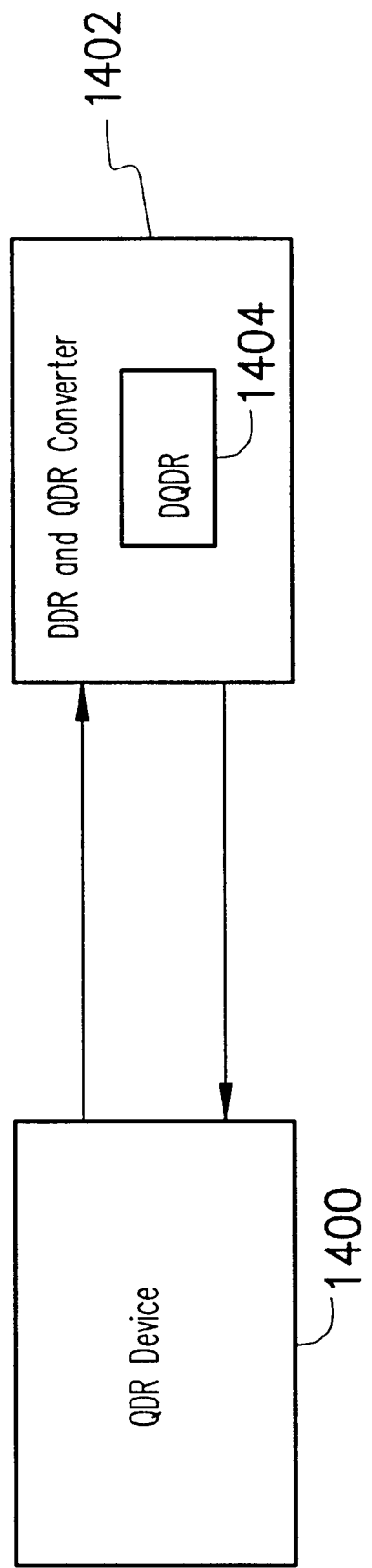
FIG. 1B shows the circuit diagram of the converter as shown in FIG. 1A.

In FIG. 1B, the circuit diagram of the converter 10 as shown in FIG. 1A is illustrated. While performing a write operation, the QDR device 1400 inputs a DQS signal to the DDR and QDR converter 1402. For a read operation, the QDR device 1400 inputs the DQS signal to the DDR and QDR converter 1402, it is then processed by the DQDR 1404 of the DDR and QDR converter 1402, and the DQS signal is then input to the QDR device 1400. Therefore, without using an external programmable logic array and double clock signal, the converter 10 directly transmits the DQS signal.

For example, an access command is output by the QDR device 1400 when the QDR device 1400 is to access data on DDR. Passing through the QDR interface 14 as shown in FIG. 1A to the command controller 122 of the converter 10, the access command of the QDR device received by the command controller 122 is processed as a corresponding DDR command. The state data register 124 is ordered to store data of the mode register set and the extended mode register used by the QDR interface 14, and the function control mechanism is activated. After activating the function control mechanism, the data mask and probe controller 1260 reads the DM signal and DQS signal of the QDR device 1400. The DM signal of the QDR device 1400 is then converted into a DDR DM signal by the data mask and probe controller 1260, while the DQS signal of the QDR device 1400 is converted into a data extraction signal used for extracting data for the QDR-to-DDR device.

When the access command of the QDR device 1400 is a data write command, the serial signals of the QDR device are converted to parallel signals by the QDR-to-DDR data converter 1264 as shown in FIG. 1A. According to the commands of the command controller 122, the converted parallel signals are transmitted to two DDR devices separately. When the access command of the QDR device 1400 is a data read command, the two signal signals of the DDR device are converted into serial signals by the DDR-to-QDR data converter 1262. According to the commands of the command controller 122, the converted serial signals are transmitted to the QDR device 1400 separately.

Figure 2A:
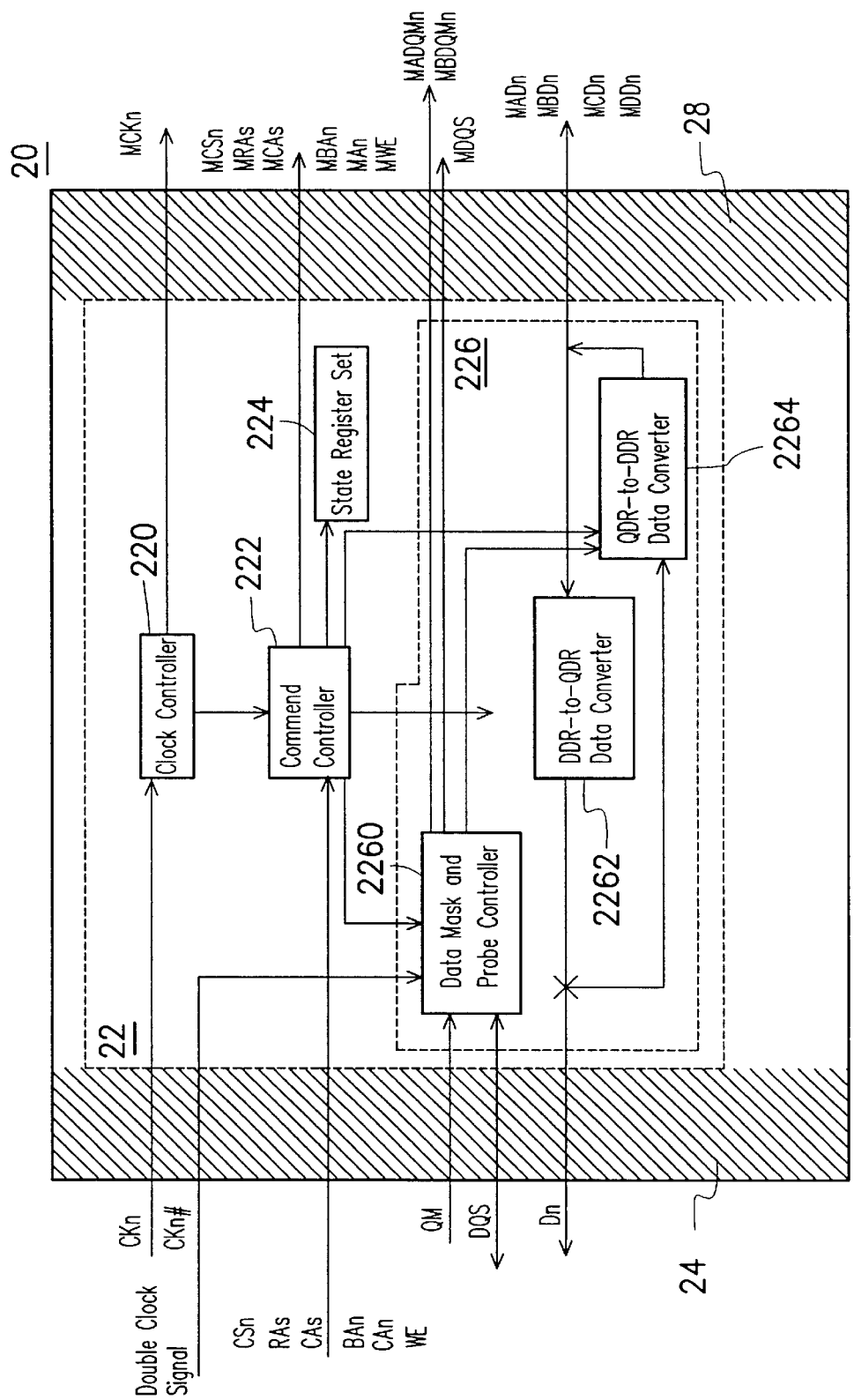
FIG. 2A shows a block diagram of a converter in a second embodiment of the invention.

FIG. 2A shows a block diagram of a converter in a second embodiment of the invention. The functions of all the apparatus are similar to those of FIG. 1A. The only difference is that the QM signal is converted into a DDR QM signal and output to the DDR devices when the data mask and probe controller 2260 obtains the QM and DQS signals, and the DQS signal is converted to the data extraction signal used by the QDR device to extract data from the DDR devices. When the DQS signal is retransmitted to the QDR device, the returned DQS signal has to be generated according to a double clock signal.

Figure 2B:
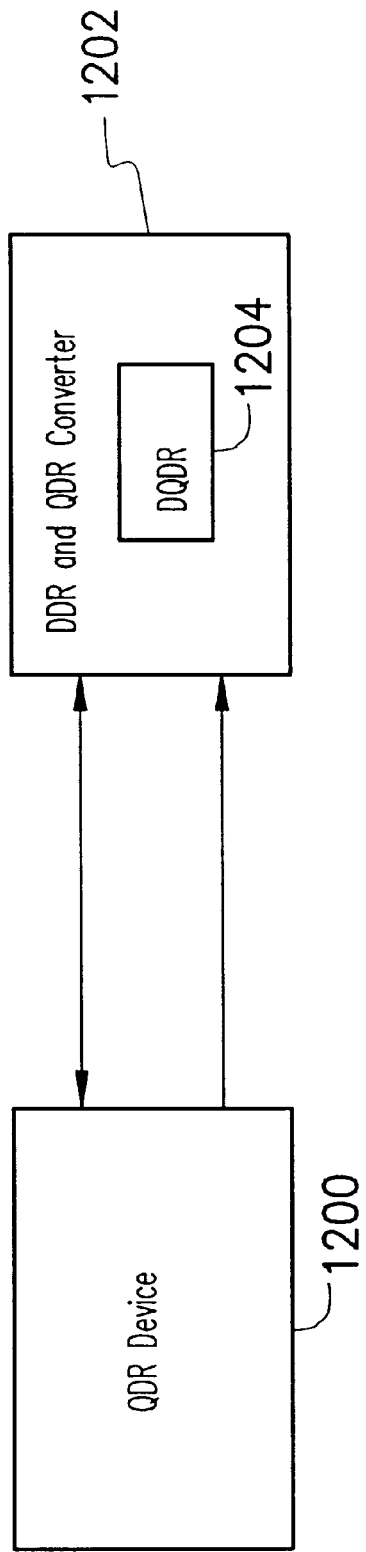
FIG. 2B shows the circuit diagram of the converter as shown in FIG. 2A.

In FIG. 2B, the circuit diagram of the converter illustrated in FIG. 2A is shown. The arrow from the QDR device 1200 to the DDR and QDR converter 1202 indicates a write operation, while the arrow from the DDR and QDR converter 1202 to the QDR device 1200 indicates a read operation. If two times of clock signal generates a return DQS signal, the DQS signal is input from the QDR device 1200 to the DDR and QDR converter 1202. For the read operation, the two times of clock signal provided by the QDR device is converted into a DQS signal by the DQDR 1204 in the DDR and QDR converter 1202 and output to the QDR device 1200.

Figure 3A:
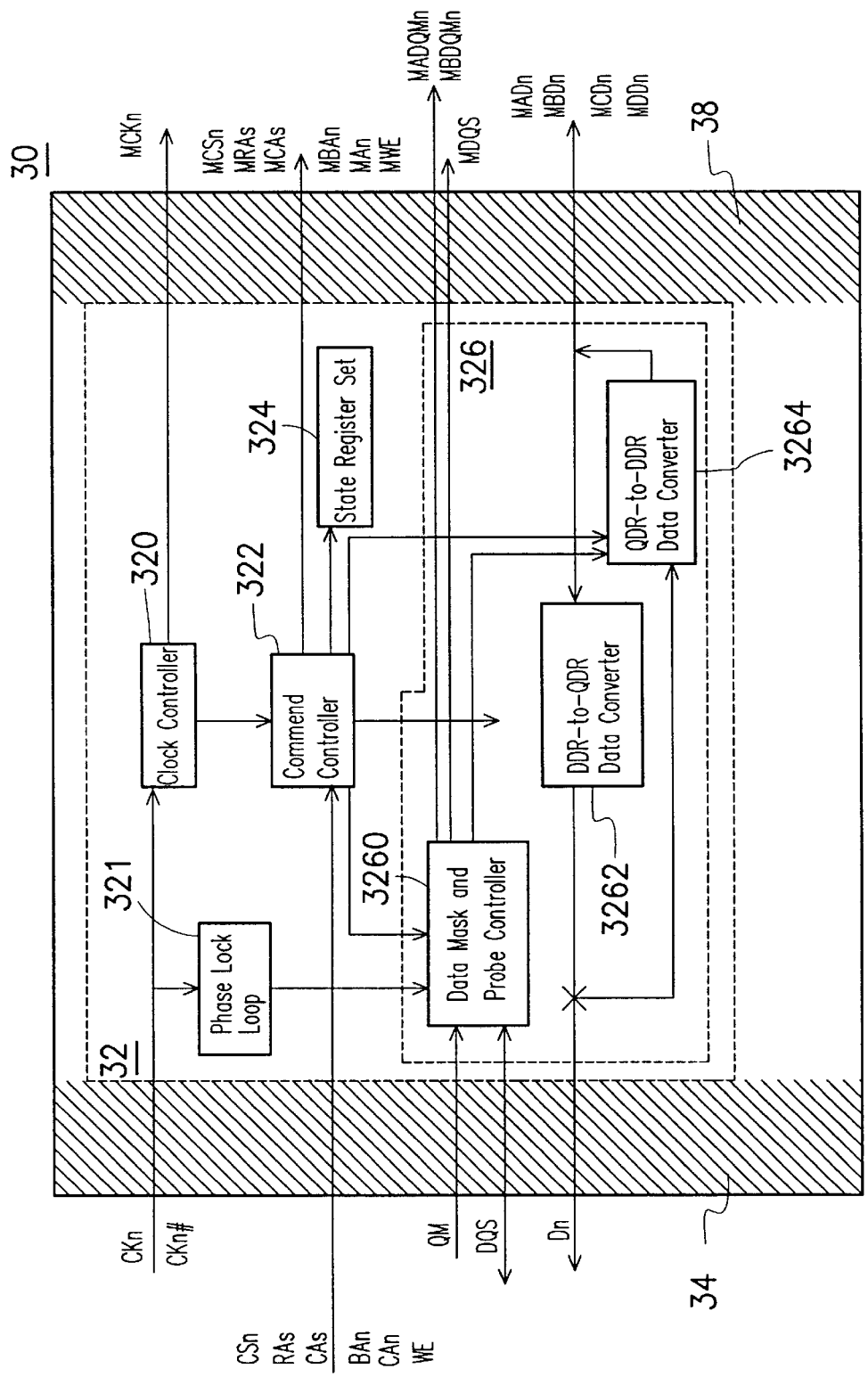
FIG. 3A shows a block diagram of a converter in a third embodiment of the invention.

In FIG. 3A, a block diagram showing the converter in a third embodiment of the invention is shown. The functions of all the apparatus are similar to those shown in FIG. 1A. The only differences are the phase lock loop (PLL) 321 and the data mask and probe controller 3260. The phase lock loop 321 generates an output clock signal with a frequency multiple of a frequency of an input clock signal after receiving such clock signal, for example, two times of the input clock signal. While obtaining the QM and DQS signals of the QDR device, the data mask and probe controller 3260 converts the QM signal into a DDR QM signal output to the DDR devices, and the DQS signal into the data extraction signal used by the QDR device to extract data from the DDR devices. When it is required to resend the DQS signal to the QDR device, the resent DQS signal is generated according to the clock signal output from the phase lock loop 321.

Figure 3B:
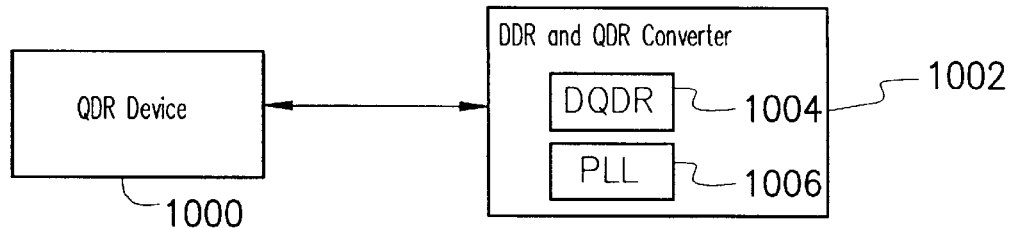
FIGS. 3B–3D show the circuit diagrams of the converter as shown in FIG. 3A.
Figure 3C:
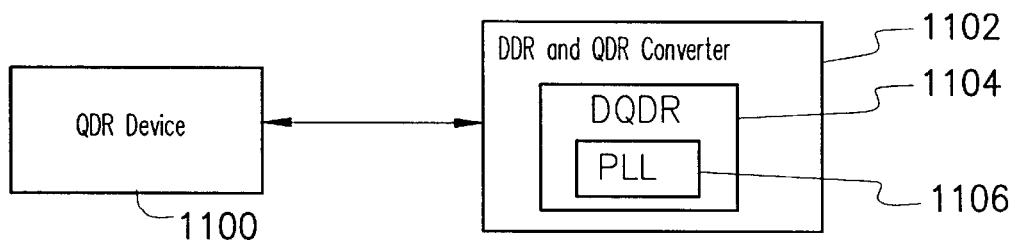
Figure 3D:
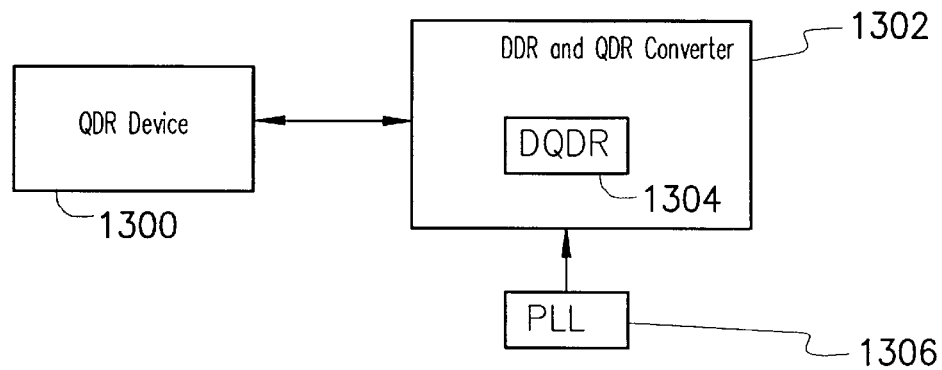

Referring to FIGS. 3B to 3D, the circuit diagram of the converter as shown in FIG. 3A is shown. The direction from the QDR device 1000 to the DDR and QDR converter 1002 indicates the write operation, while the direction from the DDR and QDR converter 1002 to the QDR device 1000 indicates the read operation. As shown in FIGS. 3B and 3D, the phase lock loop 321 can be built in the DDR and QDR converter 1002, in the DQDR 1004, or provided externally.

In one embodiment, referring to FIG. 3B, if the phase lock loop is built into the DDR and QDR converter 1002 and has a double output clock signal to the data converter, the DQS signal is output from the QDR device 1000 to the DDR and QDR converter 1002 for a read operation. For a write operation, the resent clock signal provided by a programmable logic array 1006 is converted as a DQS signal by the DQDR 1004 of the DDR and QDR converter 1002, and output to the QDR device 1000.

In another embodiment, if the phase lock loop 1106 is inside of the DQDR 1104, referring to FIG. 3C, such embodiment is illustrated. The clock signal generated by the phase lock loop 1106 is output to the data converter. In a write operation, the DQS signal is input to the DDR and QDR converter 1102 by the QDR device 1100. In a read operation, the clock signal provided by the programmable logic array 1106 is converted into the DQS signal by the DQDR 1104 of the DDR and QDR converter 1102 and output to the QDR device.

The phase lock loop 1306 provided by the external circuit is shown in FIG. 3D. The clock signal generated by the phase lock loop 1306 is input to the DDR and QDR converter 1302. In a write operation, the DQS signal is input to the DDR and QDR converter 1302 by the QDR device 1300. In a read operation, the resent clock signal provided by the phase lock loop 1306 is converted into the DQS signal by the DQDR 1304 of the DDR and QDR converter 1302 and output to the QDR device.

Figure 4:
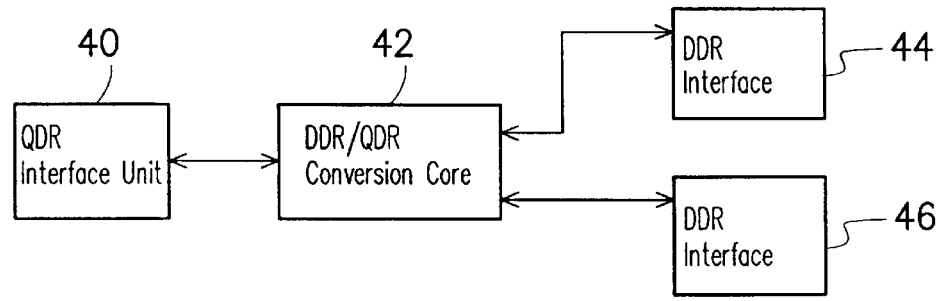
FIG. 4 shows a block diagram of a fourth embodiment of the invention.

In FIG. 4, the block diagram of a fourth embodiment of the invention is shown. The conversion core is used to convert the QDR command and data formats into the DDR command and data formats and input to the DDR device via the DDR interfaces 44 and 46. The DDR command and data formats are also converted into QDR command and data formats and sent to the QDR device via the QDR interface 40.

Figure 5:
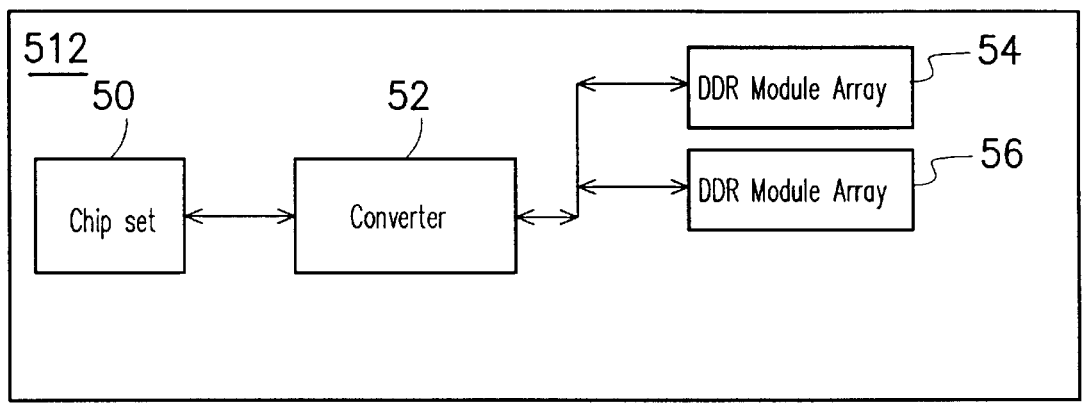
FIG. 5 shows a block diagram of a fifth embodiment of the invention.

FIG. 5 shows an embodiment to apply the memory converter into an interface card. The interface card 52 comprises a chip set 50 to support DDR module, a converter 52 and two DDR module arrays 54, 56. For convenience, the QDR interface and DDR interface are indicated as the connecting lines between the chip set 50 and the DDR module array 54, 56. Such connection method can apply the DDR module to the interface card 512 that supports the QDR module.

Figure 6:
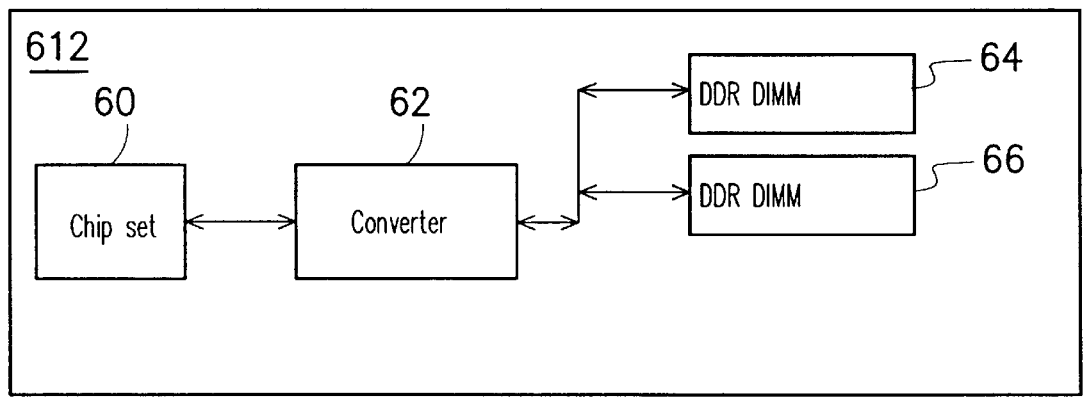
FIG. 6 shows a block diagram of a sixth embodiment of the invention.

In FIG. 6, the embodiment applying the memory converter to a motherboard is shown. The motherboard 612 comprises a chip set 60 supporting QDR module, a converter 62 and two DDR DMM's 64, 66. For convenience, the QDR interface and DDR interface of the converter 62 are indicated as the connecting lines between the chip set 60 and the DDR DIMM's 64, 66. Such a connection method can apply the DDR DIMM to the motherboard 612 that supports the QDR DIMM.

Figure 7:
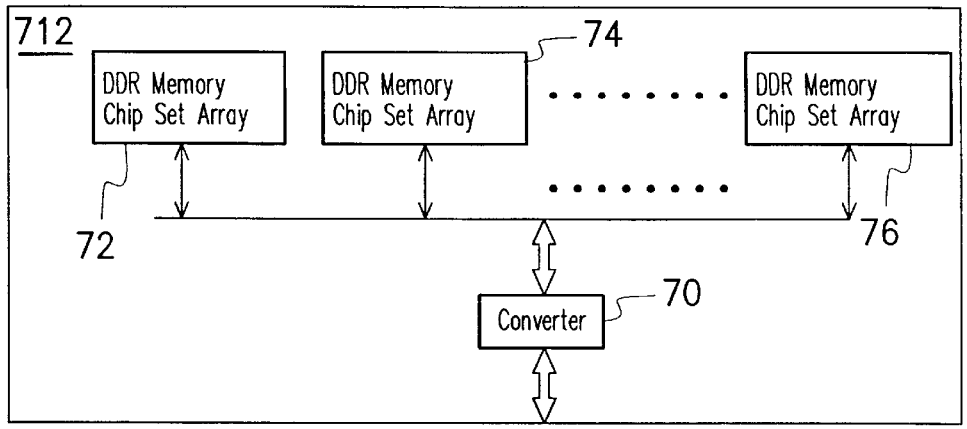
FIG. 7 shows a block diagram of a seventh embodiment of the invention.

In FIG. 7, an embodiment applying the memory converter into a memory module is illustrated. The memory module 712 comprises a converter 70 and several memory chip arrays 72 to 76. For an easy comprehension, the QDR interface and DDR interface of the converter 70 are indicated as the connecting lines between the external apparatus and the DDR chip set arrays 72 to 76. Such a connection method can apply the DDR memory chip set arrays to the memory chip set array that supports the QDR module.

Figure 8:
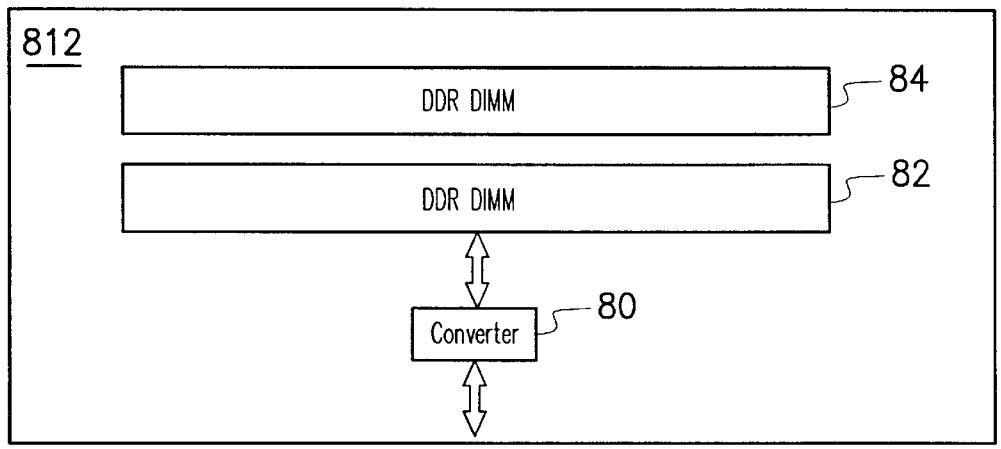
FIG. 8 shows a block diagram of a eighth embodiment of the invention.

FIG. 8 shows the block diagram of the eighth embodiment of the invention. The memory module interface 812 comprises a converter 80 and two DDR DIMM's 82, 84. For convenience, the QDR interface and DDR interface of the converter 80 are indicated as the connecting lines between the external apparatus and the DDR DIMM's 82, 84. Such a connection method can apply the DDR DIMM to the memory module interface 812 that supports the QDR module.

Figure 9:
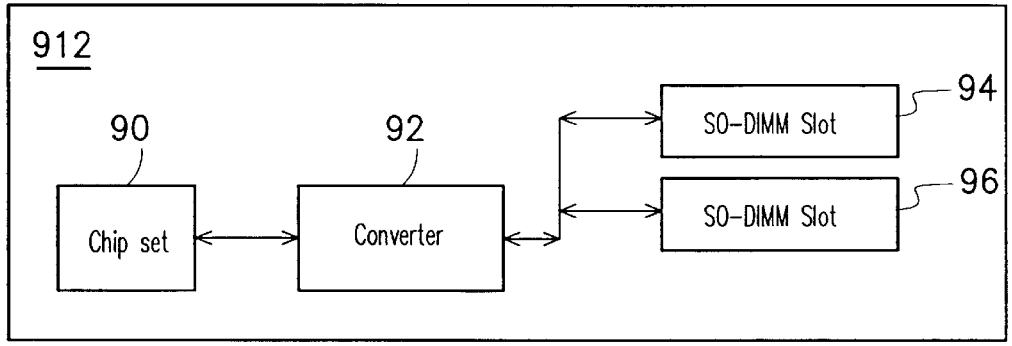
FIG. 9 shows a block diagram of a ninth embodiment of the invention.

FIG. 9 shows a block diagram of the ninth embodiment of the invention. The portable computer motherboard 912 comprises a chip set 90 that supports the QDR module, a converter 92 and two DDR DIMM slots 94, 96. For convenience, the QDR interface and DDR interface of the converter 92 are indicated as the connecting lines between the chip set 90 and the DDR DIMM slots 94, 96. Such a connection method can apply the DDR DIMM slots to the portable computer motherboard that supports the QDR DIMM slots.

According to the above, the invention includes at least the advantages of building up a conversion channel between QDR and DDR to maintain a normal operation for both DDR and QDR, and maintain a normal data process efficiency of QDR while using DDR memory.

The user does not have to purchase a new QDR memory module to obtain the QDR effect with the existent DDR memory module. One can also use the DDR memory module with the QDR memory module simultaneously to further enhance the system performance.

To the manufacturers, while fabricating the memory module and interface card, a DDR chip with a cheaper cost can be selected. With the apparatus provided by the invention, one can have the QDR process quality and effect of QDR with the existent DDR products. The invention also enables the user to achieve the QDR efficiency under the circumstances of using either DDR or QDR module.

Other embodiments of the invention will appear to those skilled in the art from consideration of the specification and practice of the invention disclosed herein. It is intended that the specification and examples are to be considered as exemplary only, with a true scope and spirit of the invention being indicated by the following claims.

What is claim is:

1. A DDR and QDR converter, comprising:
   a QDR interface, to perform a signal exchange with a QDR device;
   a DDR interface, to perform a signal exchange with a DDR device;
   a clock controller, to convert a clock signal output from the QDR device into an operation clock signal used by the DDR and QDR converter and the DDR device;
   a state register set, to store a QDR device state;
   a data converter, to convert a QDR data format into an appropriate DDR data format, and to convert a DDR data format into an appropriate QDR data format; and
   a command controller, to obtain a QDR command signal from the QDR device and process the QDR command signal into a corresponding DDR command signal output to the DDR device.

2. The DDR and QDR converter of claim 1, wherein the data converter comprises:
   a data mask and probe controller, to obtain a QM signal and a DQS signal of the QDR device, and to convert the QM signal into a DDR QM signal output to the DDR device, and to convert the DQS signal into a data extraction signal for the QDR device to extract data from the DDR device;
   a QDR-to-DDR data converter, to convert a serial signal of the QDR device into parallel signals, and to transmit the parallel signals into two DDR devices individually according to a command of the command controller; and
   a DDR-to-QDR data converter, to convert data signals of the DDR devices into a serial signal used by the QDR device, and to transmit the serial signal into the QDR device according to the command of the command controller.

3. The DDR and QDR converter of claim 1, wherein the data converter further comprises:
   a data mask and probe controller, to obtain a QM signal and a DQS signal of the QDR device, and to convert the QM signal into a DDR QM signal output to the DDR device, to convert the DQS signal into a data extraction signal for the QDR device to extract data from the DDR device, and to return the DQS signal according to two times the clock signal when the DQS signal has to be retransmitted back to the QDR device;
   a QDR-to-DDR data converter, to convert a serial signal of the QDR device into parallel signals, and to transmit the parallel signals into two DDR devices individually according to a command of the command controller; and
   a DDR-to-QDR data converter, to convert data signals of the DDR devices into a serial signal used by the QDR device, and to transmit the serial signal into the QDR device according to the command of the command controller.

4. The DDR and QDR data converter of claim 1, wherein the data converter comprises:
   a phase lock loop, to receive the clock signal and to generate an internal operation clock signal with a frequency double a frequency of the clock signal;
   a data mask and probe controller, to obtain a QM signal and a DQS signal of the QDR device, and to convert the QM signal into a DDR QM signal output to the DDR device, and to convert the DQS signal into a data extraction signal for the QDR device to extract data from the DDR device and to return the DQS signal according to the internal operation clock signal when the DQS signal has to be retransmitted back to the QDR device;
   a QDR-to-DDR data converter, to convert a serial signal of the QDR device into parallel signals, and to transmit the parallel signals into two DDR devices individually according to a command of the command controller; and
   a DDR-to-QDR data converter, to convert data signals of the DDR devices into a serial signal used by the QDR device, and to transmit the serial signal into the QDR device according to the command of the command controller.

5. A DDR and QDR converter, applied between a QDR interface and a DDR interface, wherein the QDR interface is used to perform a signal exchange with a QDR device, and the DDR interface is used to perform a signal exchange with a DDR device, the DDR and QDR converter comprising:
   a clock controller, to receive a clock signal output from the QDR device, and to convert the clock signal into a clock signal used by the DDR and QDR converter;
   a command controller, to receive a QDR command signal of the QDR device and to convert the command signal into a corresponding DDR command signal output to the DDR device; and
   a data converter, coupled to the QDR interface, the DDR interface and the command controller, to convert a QDR data format into an appropriate DDR data format, and to convert a DDR data format into an appropriate QDR data format.

6. The DDR and QDR converter of claim 5, wherein the data converter comprises:
   a data mask and probe controller, to obtain a QM signal and a DQS signal of the QDR device, and to convert the QM signal into a DDR QM signal output to the DDR device, and to convert the DQS signal into a data extraction signal for the QDR device to extract data from the DDR device;
   a QDR-to-DDR data converter, to convert a serial signal of the QDR device into parallel signals, and to transmit the parallel signals into two DDR devices individually according to a command of the command controller; and
   a DDR-to-QDR data converter, to convert data signals of the DDR devices into a serial signal used by the QDR device, and to transmit the serial signal into the QDR device according to the command of the command controller.

7. The DDR and QDR converter of claim 5, wherein the data converter further comprises:
   a data mask and probe controller, to obtain a QM signal and a DQS signal of the QDR device, and to convert the QM signal into a DDR QM signal output to the DDR device, to convert the DQS signal into a data extraction signal for the QDR device to extract data from the DDR device, and to return the DQS signal according to two times of the clock signal when the DQS signal has to be retransmitted back to the QDR device;
   a QDR-to-DDR data converter, to convert a serial signal of the QDR device into parallel signals, and to transmit the parallel signals into two DDR devices individually according to a command of the command controller; and
   a DDR-to-QDR data converter, to convert data signals of the DDR devices into a serial signal used by the QDR device, and to transmit the serial signal into the QDR device according to the command of the command controller.

8. The DDR and QDR data converter of claim 5, wherein the data converter comprises:
a programmable logic array, to receive the clock signal and to generate a return clock signal with a frequency double a frequency of the clock signal;
a data mask and probe controller, to obtain a QM signal and a DQS signal of the QDR device, and to convert the QM signal into a DDR QM signal output to the DDR device, and to convert the DQS signal into a data extraction signal for the QDR device to extract data from the DDR device and to return the DQS signal according to the return clock signal when the DQS signal has to be retransmitted back to the QDR device;
a QDR-to-DDR data converter, to convert a serial signal of the QDR device into parallel signals, and to transmit the parallel signals into two DDR devices individually according to a command of the command controller; and
a DDR-to-QDR data converter, to convert data signals of the DDR devices into a serial signal used by the QDR device, and to transmit the serial signal into the QDR device according to the command of the command controller.

9. A DDR and QDR converter, comprising:
a QDR interface, used to perform a signal exchange with a QDR device;
a DDR interface, used to perform a signal exchange with a DDR device;
a conversion core, to convert a QDR command and data format into a DDR command and data format sent to the DDR device via the DDR interface, and to convert a DDR command and data format into a QDR command and data format sent to the QDR device via the QDR interface.

10. An interface card using a DDR and QDR converter, applied to a circuit board supporting a QDR module, the circuit comprising at least a chip set that support the QDR module, the interface card comprising:
at least a DDR module array; and
a DDR and QDR converter, comprising:
a QDR interface, to perform a signal exchange with the chip set;
a DDR interface, to perform a signal exchange with the DDR module array; and
a conversion core, to convert a QDR command and data format into a DDR command and data format output to the DDR module array via the DDR interface, and to convert a DDR command and data format into a QDR command and data format output to the chip set that support the QDR module via the QDR interface.

11. A motherboard using a DDR and QDR converter, comprising:
a chip set, to support a QDR module; and
a DDR and QDR converter, further comprising:
at least a DDR DIMM;
a DDR and QDR converter, having a QDR interface to perform a signal exchange with the chip set, a DDR interface, to perform a signal exchange with the DDR DIMM, and a conversion core, to convert a QDR command and data format into a DDR command and data format output to the DDR DIMM via the DDR interface, and to convert a DDR command and data format into a QDR command and data format output to the chip set that support the QDR module via the QDR interface.

12. A memory module using a DDR and QDR converter, applied to a memory that supports a QDR memory module, the memory module comprising:
at least a DDR memory chip set array; and
a DDR and QDR converter, having a QDR interface to perform a signal exchange with the memory, a DDR interface, to perform a signal exchange with the DDR memory chip set array, and a conversion core, to convert a QDR command and data format into a DDR command and data format output to the DDR memory chip set array via the DDR interface, and to convert a DDR command and data format into a QDR command and data format output to the memory.

13. A memory module interface using a DDR and QDR converter, comprising:
at least a DDR DMM; and
a DDR and QDR converter, having a QDR interface to perform a signal exchange with the memory module interface, a DDR interface, to perform a signal exchange with the DDR DIMM, and a conversion core, to convert a QDR command and data format into a DDR command and data format output to the DDR DIMM via the DDR interface, and to convert a DDR command and data format into a QDR command and data format output to the memory module interface.

14. A portable computer motherboard using a DDR and QDR converter, comprising:
a chip set that support a QDR module; and
a DDR and QDR converter, having a QDR interface to perform a signal exchange with the chip set, a DDR interface providing at least a SO-DIMM slot, and a conversion core, to convert a QDR command and data format into a DDR command and data format output to the SO-DIMM slot via the DDR interface, and to convert a DDR command and data format into a QDR command and data format output to the chip set via the QDR interface.

* * * * *